(12) United States Patent
Do et al.

(10) Patent No.: US 12,422,325 B2
(45) Date of Patent: Sep. 23, 2025

(54) SENSOR PACKAGE HAVING A CHANNEL INTEGRATED WITHIN A SUBSTRATE

(71) Applicant: All Sensors Corporation, Morgan Hill, CA (US)

(72) Inventors: Duy Trung Do, San Jose, CA (US); Derek Dean Bowers, Morgan Hill, CA (US); Dale Allan Dauenhauer, San Jose, CA (US)

(73) Assignee: All Sensors Corporation, Morgan Hill, CA (US)

( * ) Notice: Subject to any disclaimer, the term of this patent is extended or adjusted under 35 U.S.C. 154(b) by 268 days.

(21) Appl. No.: 17/855,935

(22) Filed: Jul. 1, 2022

(65) Prior Publication Data

US 2024/0003770 A1    Jan. 4, 2024

(51) Int. Cl.
*G01L 19/14* (2006.01)
*G01L 19/00* (2006.01)
*H05K 1/02* (2006.01)
*H05K 1/18* (2006.01)

(52) U.S. Cl.
CPC ........ *G01L 19/148* (2013.01); *G01L 19/0007* (2013.01); *G01L 19/0069* (2013.01); *H05K 1/0272* (2013.01); *H05K 1/181* (2013.01); *H05K 2201/10151* (2013.01)

(58) Field of Classification Search
CPC ............... G01L 13/025; G01L 19/0007; G01L 19/0038; G01L 19/0069; G01L 19/143; G01L 19/148; G01L 19/14; G01L 19/142; G01L 19/141; G01L 19/144; G01L 19/147; G01L 19/0084; G01L 19/0092; G01L 19/06; G01L 13/00; G01L 13/02; G01L 9/0051; H05K 1/0272; H05K 1/181; H05K 2201/10151
USPC ...................... 73/64.46, 861.42, 756; 347/85
See application file for complete search history.

(56) References Cited

U.S. PATENT DOCUMENTS

| | | | |
|---|---|---|---|
| 6,023,978 A | 2/2000 | Dauenhauer et al. | |
| 7,290,453 B2 | 11/2007 | Brosh | |
| 8,220,330 B2 | 7/2012 | Miller et al. | |
| 10,285,275 B2 | 5/2019 | Larson et al. | |
| 2007/0013752 A1* | 1/2007 | Wilson | B41J 2/17566 347/85 |
| 2009/0194831 A1 | 8/2009 | Casey et al. | |

(Continued)

FOREIGN PATENT DOCUMENTS

| | | |
|---|---|---|
| CN | 107894294 A | 4/2018 |
| EP | 3 147 257 A1 | 3/2017 |
| EP | 3 705 865 A2 | 9/2020 |

OTHER PUBLICATIONS

International Search Report and Written Opinion for International Application No. PCT/US2023/026439 mailed Sep. 22, 2023.

*Primary Examiner* — John E Breene
*Assistant Examiner* — Truong D Phan
(74) *Attorney, Agent, or Firm* — Wolf, Greenfield & Sacks, P.C.

(57) ABSTRACT

A sensor package includes a substrate and a channel within the substrate. The channel is configured to allow flow of a fluid therethrough. The sensor package also includes a sensor disposed on the substrate and a lid. The sensor is configured to sense a property of the fluid. The lid forms at least one cavity between the lid and the substrate.

19 Claims, 8 Drawing Sheets

(56) References Cited

U.S. PATENT DOCUMENTS

2019/0254168 A1   8/2019  Larson et al.
2020/0284677 A1*  9/2020  Wagner ................ G01L 9/0051

* cited by examiner

SENSOR PACKAGE HAVING A CHANNEL INTEGRATED WITHIN A SUBSTRATE

BACKGROUND

1. Technical Field

The apparatus and techniques described herein relate to sensor packages having a channel within a substrate coupled to a sensor.

2. Discussion of the Related Art

Sensors are used in a variety of applications. For example, pressure sensors are used to sense the pressure of a fluid, such as a gas or liquid. Applications of pressure sensors include automotive applications, HVAC systems, and speed sensors for airborne vehicles, for example.

SUMMARY

A sensor package may comprise a substrate: a channel within the substrate, the channel being configured to allow flow of a fluid therethrough; a sensor disposed on the substrate, the sensor being configured to sense a property relating to the fluid; and a lid covering the sensor and forming at least one cavity between the lid and the substrate.

The sensor may be a pressure sensor.

The pressure sensor may be configured to sense a pressure differential.

The substrate may comprise a printed circuit board.

The at least one cavity may comprise a first cavity between the sensor and the lid.

The sensor may be configured to perform sensing using at least a pressure of the first cavity.

The sensor package may further comprise an opening in the lid allowing fluidic access to the first cavity.

The sensor package may further comprise a port coupled to the opening.

The sensor package may further comprise an opening extending between the sensor and the channel.

The opening may be a first opening, and the sensor may be disposed on a surface of the substrate. The sensor package may further comprise a second opening extending between the channel and the surface.

The at least one cavity may comprise a second cavity between the second opening and the lid.

The sensor package may further comprise a port coupled to the second opening.

The port may extend to a top of the lid.

The lid may comprise a channel extending from the second opening to the port.

The port may extend to a side of the lid.

The lid may have a top portion and a plurality of side portions forming first and second cavities between the top portion and the substrate.

A method of forming a sensor package may comprise: forming a substrate having a channel within the substrate, the channel being configured to allow flow of a fluid therethrough; disposing a sensor on the substrate, the sensor being configured to sense a property relating to the fluid; and disposing a lid on the substrate covering the sensor and forming at least one cavity between the lid and the substrate.

Forming the substrate having the channel may comprise removing material from the substrate or omitting material from an intermediate region of the substrate.

The substrate may comprise a printed circuit board and forming the substrate having the channel may comprise omitting an intermediate layer of the printed circuit board.

The method may further comprise electrically connecting the sensor to a conductor on the substrate.

The method may further comprise cutting through the substrate to separate the sensor package from a second sensor package.

A sensor package may comprise: a substrate: a channel within the substrate, the channel being configured to allow a medium to pass therethrough; a sensor disposed on the substrate, the sensor being configured to sense a property relating to the medium; and a lid covering the sensor, the lid having at least one wall adhered to the substrate.

A bottom edge of the at least one wall may be adhered to the substrate.

The lid may further comprise a top portion extending above the sensor.

The at least one wall may comprise a plurality of walls and the top portion may extend between the plurality of walls.

The medium may comprise a fluid or light.

A top of the channel may be below a top surface of the substrate and a bottom of the channel may be above a bottom surface of the substrate.

The foregoing summary is provided by way of illustration and is not intended to be limiting.

BRIEF DESCRIPTION OF DRAWINGS

In the drawings, each identical or nearly identical component that is illustrated in various figures is represented by a like reference character. For purposes of clarity, not every component may be labeled in every drawing. The drawings are not necessarily drawn to scale, with emphasis instead being placed on illustrating various aspects of the techniques and devices described herein.

DETAILED DESCRIPTION

Figure 1:
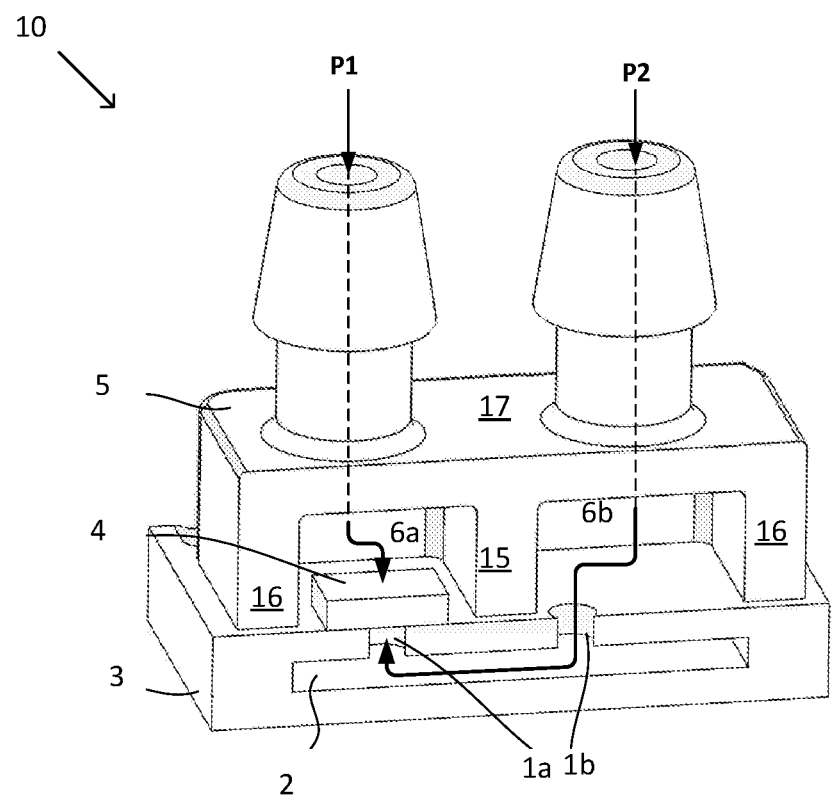
FIG. 1 shows an example of a sensor package.

The inventors have recognized and appreciated that existing packages for sensors may have complex or expensive fabrication processes. Additionally, existing sensor packages have a construction that is prone to leaks, e.g., due to failure of adhesive material.

Described herein is an improved package for a sensor, such as pressure sensor, for example. The sensor package may include a channel formed within a substrate and coupled to a sensor. The substrate may form the top, bottom and sides of the channel. Advantageously, a channel formed within a substrate may be well-sealed and highly resistant to leaks. As one example, a package with a channel formed within a printed circuit board (PCB) substrate has been demonstrated to withstand pressures up to 150 PSI without failure. However, the sensor packages described herein are not limited to particular substrate materials and may be able to withstand higher or lower pressures. A sensor package with a channel formed in a substrate may have other advantages. For example, such a sensor package may be easier or less expensive to manufacture than prior sensor packages. Alternatively or additionally, such a sensor package may be made relatively small and/or with a low profile, as a sensor package having a channel formed in a substrate may allow connections to be made on a top side of the package, reducing or eliminating a need for connections to be made to a bottom side of the package.

A sensor package as described herein may have a substrate formed of any of a variety of materials. As mentioned above, the substrate may include a PCB. Any of a variety of types of PCBs may be used, such as FR4, for example, or another glass-reinforced epoxy laminate material or a flex circuit PCB material, such as a flexible polymer (e.g., polyimide). In some embodiments, the substrate may include or be formed of any of a variety of different materials, such as a ceramic material, glass, a composite material, etc. The sensor packages described herein are not particularly limited as to the substrate material.

As mentioned above, a channel for a carrying a medium, such as fluid (e.g., a gas, a liquid) or light, may be formed within the substrate. If the fluid is a gas, the fluid may be any type of gas, including air, for example. The channel may be formed in a variety of ways, such as by omitting material in the desired shape/size of a channel when forming an intermediate layer or region of the substrate, or by removing material from the intermediate layer or region using any of a variety of processes such as physical and/or chemical material removal processes. One or more openings may be formed extending from the channel to a surface of the substrate. In some embodiments, the surface of the channel may be coated or plated (e.g., with a non-reactive material) to avoid or limit contact between the fluid in the channel and the substrate. Coating or plating the channel may be advantageous in applications where the fluid is a liquid, but is not limited to such applications. If the medium carried through the channel is light, the channel may be coated with a reflective material to guide the light through the package. Alternatively or additionally, an optical fiber may be disposed within the channel to carry light therethrough.

A sensor may be disposed on the substrate and may cover an opening that extends to the channel within the substrate. The sensor may be any of a variety of sensors, examples of which include a pressure sensor, a flow sensor, a light/optical sensor, a thermal sensor, moisture sensor, gas detection sensor, chemical detection sensor, pressure switch, or leak sensor, by way of example. A seal may be formed between the sensor and the opening such that the top and bottom surfaces of the pressure sensor are at different pressures. If the sensor is a pressure sensor, the pressure sensor may sense a pressure of a fluid (e.g., a gas, a liquid) within the channel and/or in an area above the pressure sensor. In some cases, the pressure sensor may be configured to measure the differential pressure between the top and bottom of the pressure sensor, which in embodiments described herein is the pressure difference between that of the fluid in the channel and that of a fluid at the opposite surface of the pressure sensor. However, in other embodiments the pressure sensor may measure an absolute pressure. The pressure sensor may be any of a variety of pressure sensors, and in some embodiments the pressure sensor may include a sensor die, which may include a microelectromechanical system (MEMS) pressure sensor. However, the pressure sensor need not include a sensor die, and need not be a MEMS pressure sensor. In other embodiments, a pressure sensor may use a ceramic or metal diaphragm to measure pressure. In general, the pressure sensor may be any type of pressure sensor, including, but not limited to potentiometric pressure sensors, inductive pressure sensors, capacitive pressure sensors, piezoelectric pressure sensors, strain gauge pressure sensors and variable reluctance pressure sensors.

The pressure sensor may measure pressure within any range of pressures, including but not limited to low pressures, medium pressures and high pressures. Some pressure sensors which may be used can measure very low pressures, down to ¼ of an inch of water pressure, which can allow applications such as measuring human breath for various medical applications, such as in ventilators. However, the range of pressured that can be measured is not limited, and the techniques and apparatus described herein also apply to sensors that measure higher pressures. Again, the techniques and apparatus described herein are not limited to particular types of pressure sensors, nor are they limited to pressure sensors.

As mentioned above, the sensor may sense a characteristic other than pressure. For example, the sensor may be a flow sensor. In some embodiments, a flow sensor may measure differential pressure between two sides of the flow sensor, and flow may be calculated from the measured differential pressure. If the sensor is a temperature, humidity, gas or chemical detection sensor, the channel within the substrate may carry the sample to be measured. The bottom side of the sensor adjacent the channel may be used to perform the measurement. If the sensor is an light/optical sensor, light may propagate through the channel and be detected at the sensor (e.g., at the bottom of the sensor). However, the apparatus and techniques described herein are not limited to particular sensors or to particular configurations of the sensor package.

A sensor may be mounted in various ways. If the sensor includes a sensor die, the sensor die may be mounted face-up on the substrate, with conductive connections (e.g., wire bonds) extending from a top surface of the sensor die to conductors (e.g., traces) on the substrate. As another example, the sensor die may be mounted on the substrate in an upside-down orientation, e.g., by a flip-chip process, with conductive connections (e.g., solder balls) connecting the sensor die to the conductors on the substrate. However, the sensor packages described herein are not limited to particular orientations or mounting techniques for the sensor die.

A lid may be adhered to the substrate over the sensor and spaced apart from the sensor. The lid and the substrate may be sealed, forming one or more cavities over the sensor and/or over one or more openings to the channel. The cavities may be voids free of immovable solid material, capable of containing a fluid. The lid may provide fluid access to the cavities through one or more openings in the lid which may be coupled to ports allowing one or more lumens, such as hose or tube, to be fluidically coupled to the sensor package. The lid may be formed of any of a variety of materials, such as a metal, a polymer, etc. The lids described herein are not limited to particular materials.

FIG. 1 shows an example of a sensor package 10, according to some embodiments. The sensor package 10 includes a substrate 3 and a channel 2 within the substrate 3. Forming the channel 2 within the substrate 3 may provide for robust sealing of the channel 2. The sensor package 10 also includes a plurality of openings 1a, 1b, extending between the top of the substrate 3 and the channel 2. A sensor 4, which may be a pressure sensor, is disposed on the top of the substrate 3 covering the opening 1a. A lid 5 is also disposed on the top of the substrate 3 over the sensor 4, forming cavity 6a over the top of the sensor 4 and cavity 6b over the top of the opening 1b. The lid may include one or more top portions 17 and one or more side portions, such as walls 15, 16. The lid may include an interior wall 15 to fluidically isolate the cavities 6a and 6b from one another. The lid may also include exterior walls 16 to fluidically isolate the cavities 6a and 6b from the environment. The exterior walls 16 may fully surround and seal the cavities 6a and 6b on all four sides (not shown in FIG. 1 for purposes of illustration). In this example ort P1 allows access to cavity 6a and port P2 allows access to cavity 6b.

If sensor 4 is a pressure sensor, it may sense the pressure difference between that of the cavity 6a and the channel 2, which may be a differential measurement between the pressures at port P1 and port P2. Ports P1 and P2 may be open to allow fluidic passage through openings in the lid 5. However, the differential measurement need not be performed between the pressures at open ports P1 and P2. In other embodiments, port P1 may be omitted or sealed. For example, the top of the cavity 6a may be completely covered by the lid 5, or port P1 may be closed by a valve or other device, thus sealing the cavity 6a at a fixed pressure. As another example, port P2 may be omitted or sealed. For example, the top of the cavity 6b may be completely covered by the lid 5, or port P2 may be closed by a valve or other device, thus sealing the cavity 6b at a fixed pressure. When a cavity is sealed, the differential measurement may be made with between that of one port and a sealed cavity. However, the techniques and sensor packages described herein are not limited as to which pressures are sensed.

Figure 2:
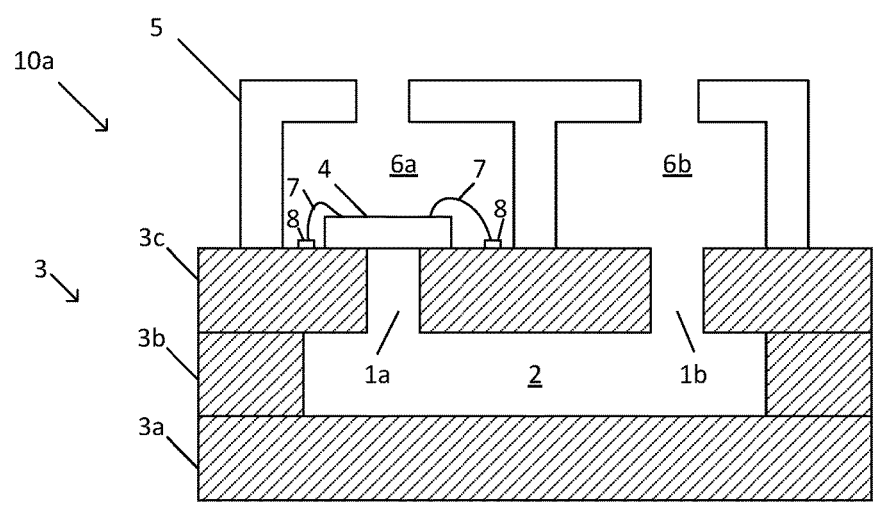
FIG. 2 shows a cross-sectional view of a sensor package with a three-layer substrate.

FIG. 2 shows a cross-sectional view of a pressure sensor 10a with a three-layer substrate 3 including a bottom substrate layer 3a, a middle substrate layer 3b and a top substrate layer 3c. In this example, the channel 2 may be formed by omitting or removing material from a portion of the middle substrate layer 3b. The bottom substrate layer 3a forms the bottom of the channel 2. The top substrate layer 3c forms the top of the channel 2. Openings 1a and 1b may be formed in the top substrate layer 3c. The substrate layers 3a-3c may be formed of the same materials or different materials. In some embodiments, the substrate 3 may be a PCB, and the substrate layers 3a-3c may be layers of the PCB. Sensor 4, which may be a pressure sensor, is disposed on the top of the substrate 3 and covers the opening 1a. Sensor 4 may be electrically connected to conductors 8 of the substrate through conductive connections 7.

Figure 3A:
FIGS. 3A-3E show a fabrication process for a sensor package.
Figure 3B:
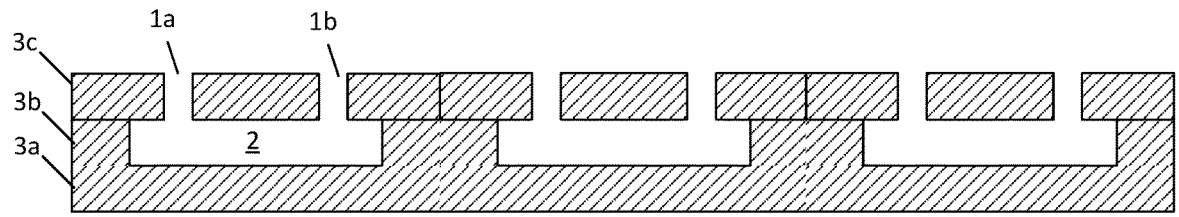

The substrate 3 may be formed in a variety of ways. In some embodiments, the substrate 3 may be formed in a build-up manner in which substrate layer 3b is disposed on substrate layer 3a, and then substrate layer 3c is formed on substrate layer 3b. FIGS. 3A-3B show an example of a process for forming the substrate 3 in a build-up manner. The process illustrated in FIGS. 3A-3B may be used for forming a plurality of sensor packages. As illustrated in FIG. 3A, the channel 2 may be formed by omitting a region of material from substrate layer 3b when the substrate layer 3b is disposed on substrate layer 3a, or the channel 2 may be formed by removing material from substrate layer 3b using any suitable process, including chemical processes (e.g., etching) or mechanical processes (e.g., milling). FIG. 3B illustrates forming substrate layer 3c over substrate layer 3b.

Each of the adjacent substrate layers 3a-3c may be adhered to one another. The openings 1a and 1b may be formed by omitting a region of material from substrate layer 3c or removing a region of material from substrate layer 3c. If openings 1a, 1b are formed by removing material from substrate layer 3c, the material may be removed using any suitable process, including chemical processes (e.g., etching) or mechanical processes (e.g., drilling).

In some embodiments, the substrate 3 may be formed in the opposite order, beginning from the top substrate layer 3c. For example, substrate layer 3c may be prepared by forming the openings 1a, 1b, then the substrate layer 3b may be disposed on the substrate layer 3c. As described above, channel 2 may be formed in substrate layer 3b by omitting or removing material from substrate layer 3b. Then, the substrate layer 3a may be disposed on the substrate layer 3b.

Figure 3C:
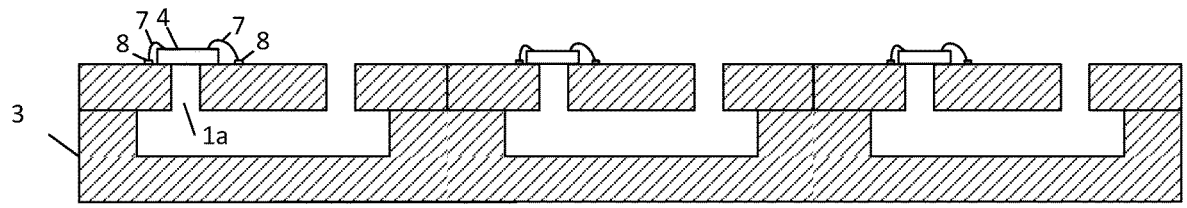

Following the formation of the substrate 3, the sensor 4 may be disposed on the substrate 3. As illustrated in FIG. 3C, the sensor 4 may be disposed over the opening 1a. The sensor 4 may be adhered to the substrate 3 to form a seal that substantially prevents passage of a fluid (e.g., gas) between opening 1a and cavity 6a. Any suitable adhesive material may be used to form the seal. Conductive connections 7 be formed between the sensor 4 and one or more conductors 8 on the substrate 3a. In some embodiments, the conductive connections 7 may be wire bonds or solder balls of a flip-chip connection.

Figure 3D:
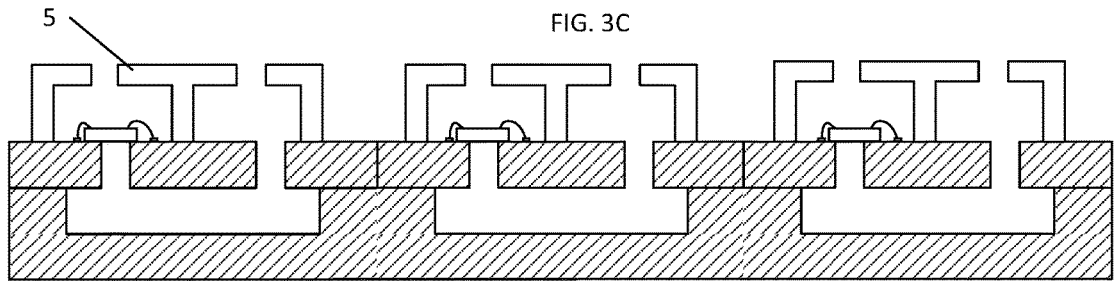
Figure 3E:
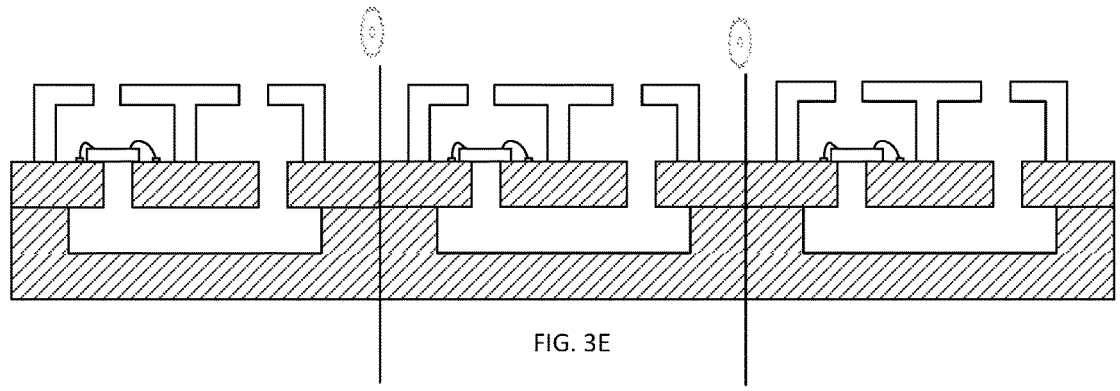
Figure 3F:
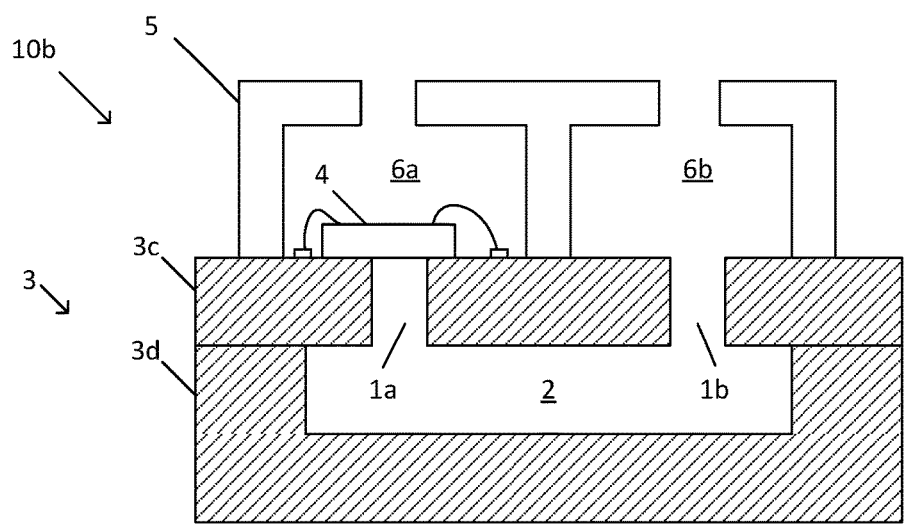
FIG. 3F shows a cross-sectional view of a sensor package with a two-layer substrate.

As illustrated in FIG. 3D, the lid 5 may then be disposed on the substrate 3. In some embodiments, the lid 5 and substrate 3 may be turned upside down, and the substrate 3 may be placed on top of the lid 5. The lid 5 and the substrate 3 may be adhered to one another using any suitable adhesive. After the lids are attached, the structure illustrated in FIG. 3E may then be separated into individual sensor packages. For example, as illustrated in FIG. 3F, the structure may be diced along the vertical lines to produce individual sensor packages. The resulting individual sensor packages may have further packaging steps applied, such as encapsulation (e.g., in a molding compound). For some instances, the edges of the of the substrate (left and right sides) of the individual packages may be left bare (e.g., free of encapsulation material).

Figure 3G:
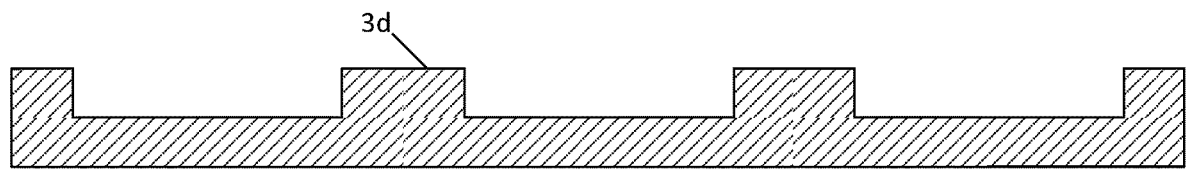
FIG. 3G illustrates forming a recess in a substrate layer.

The substrate 3 may have any number of layers. In some embodiments, the substrate 3 may be a two-layer substrate. FIG. 3F shows a cross-sectional view of a pressure sensor 10b with a two-layer substrate 3 including a bottom substrate layer 3d and a top substrate layer 3c. Substrate layer 3d has a recessed region that is free of material, to form channel 2. As illustrated in FIG. 3G, the recessed region of substrate layer 3d may be formed in substrate layer 3d by removing material from the top of substrate layer 3d using any suitable process, including chemical processes (e.g., etching) or mechanical processes (e.g., milling). After forming the recess, the substrate layers 3c and 3d may be adhered to one another to form the substrate 3. Once the substrate 3 is formed, fabrication may then proceed as illustrated in FIGS. 3C-3E.

Figure 4A:
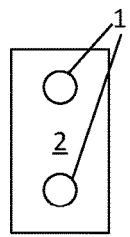
FIGS. 4A-4E each shows a top view of a channel having a different shape.
Figure 4B:
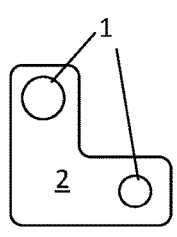
Figure 4C:
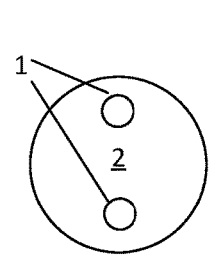
Figure 4D:
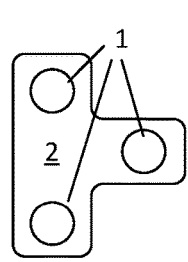
Figure 4E:
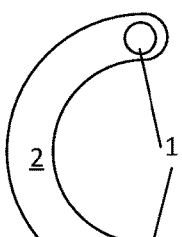
Figure 4F:
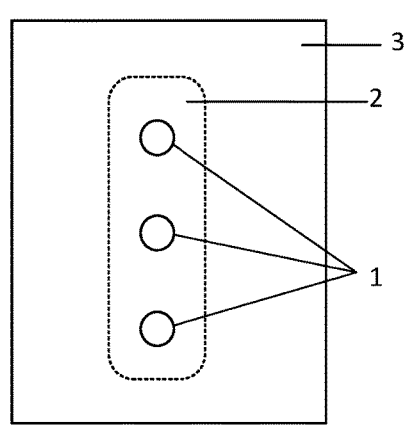
FIG. 4F shows an example of a channel with three openings.
Figure 4G:
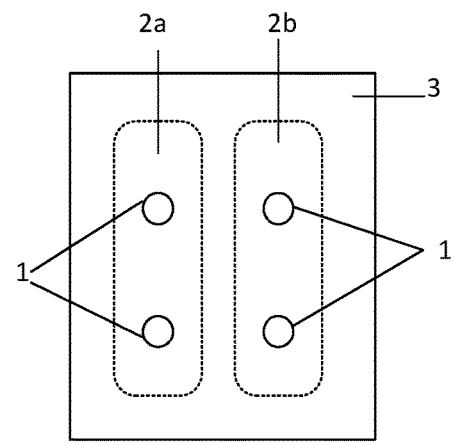
FIG. 4G illustrates an example of a sensor package with two channels.

The channel 2 may have any suitable shape. FIGS. 4A-4E each shows a top view of a channel 2 having a different shape. The channel shape may be rectangular, as shown in FIG. 4A, L-shaped or bent as shown in FIG. 4B, round, as shown in FIG. 4C, a T-shape, as shown in FIG. 4D, or having an arcuate shape, as shown in FIG. 4E. It should be appreciated the shape of the channel 2 may take many different forms. Further, there may be any number of openings 1 to access the channel, as illustrated in FIGS. 4A-4F, which shows examples with two or three openings 1. However, the channel 2 may have fewer than two or more than three openings may be provided in other embodiments. In some embodiments, the substrate 3 may have more than one channel 2. FIG. 4G illustrates an example with two channels 2a and 2b, each having two openings 1.

Figure 5A:
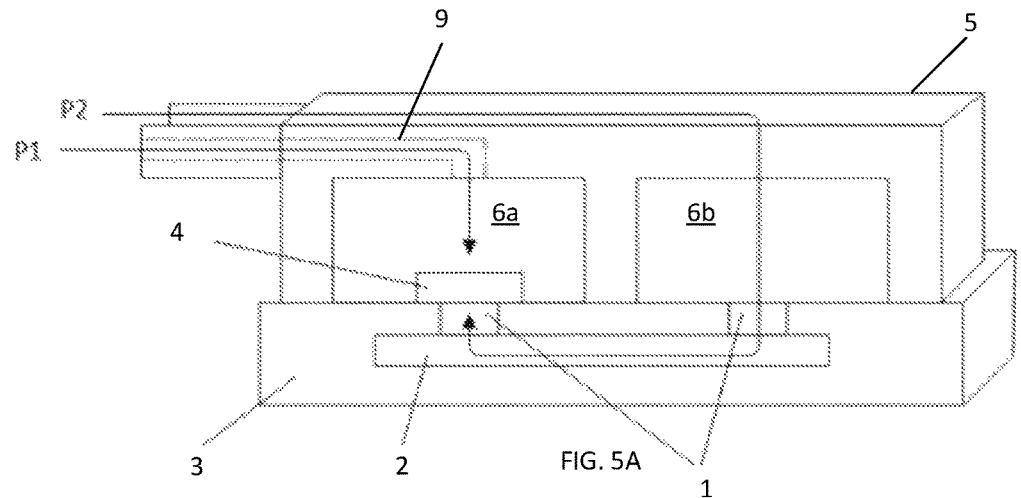
FIGS. 5A-5C show sensor packages with various configurations of ports and a sensor package without ports.
Figure 5C:
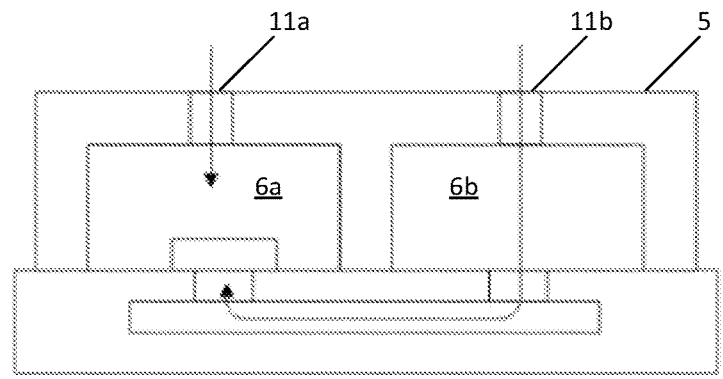
Figure 5B:
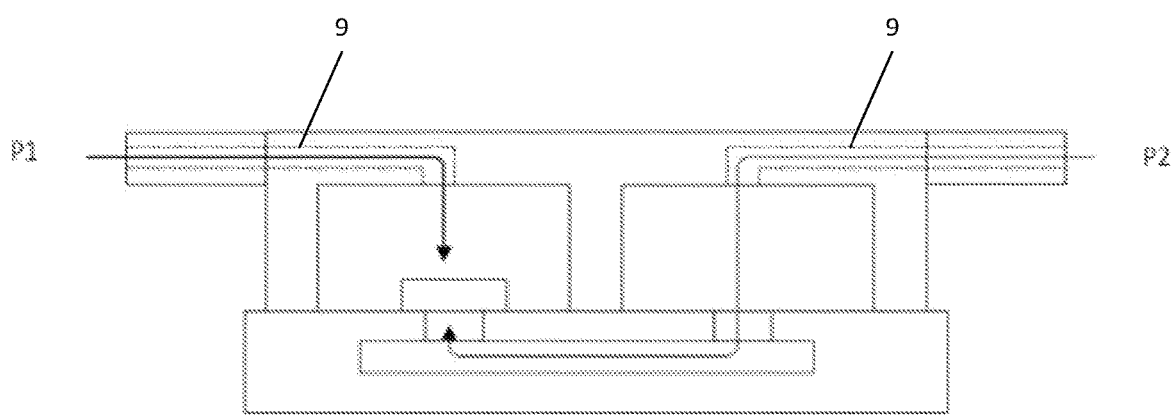

Access to the cavities (e.g., 6A, 6B) formed by lid 5 and substrate 3 may be provided at various locations and in various ways. FIG. 5a shows an example in which ports P1 and P2 are disposed on the same side (left side) of the lid 5. FIG. 5B shows an example in which ports P1 and P2 are disposed on opposite sides of the lid 5. To access cavities 6A and 6B, channels 9 may be formed in the lid 5 extending from a cavity to its respective port. In some embodiments, ports such as P1 and P2 may be omitted. In the embodiment of FIG. 5C, no ports are included, and access to cavities 6a, 6b is provided through openings 11a, 11b, in lid 5, respectively.

Figure 6A:
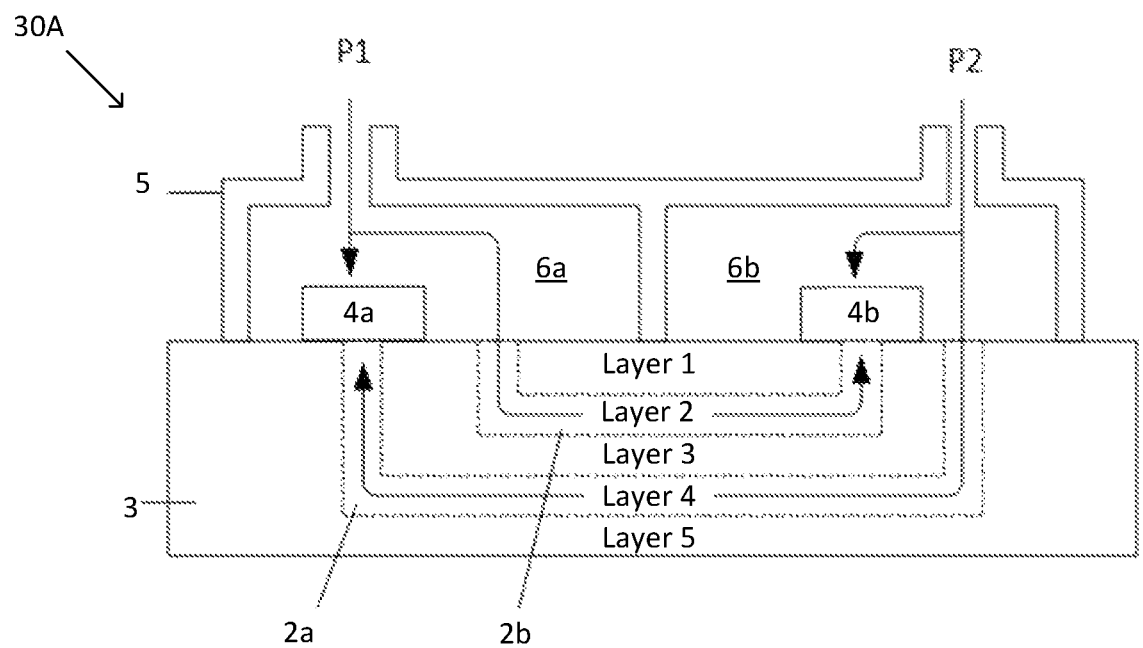
FIGS. 6A and 6B show sensor packages have two sensors and a plurality of channels.

In some embodiments, a package may include a plurality of sensors. A plurality of sensors may be useful for various reasons, such as cancelling or reducing offset error, for example. FIG. 6A shows an example of a sensor package 30A having two sensors 4a and 4b. The bottom of sensor 4a is coupled to channel 2a, which extends through the substrate 3 to cavity 6b (coupled to port P2). The top of sensor 4a is within cavity 6a, which is coupled to port P1. The bottom of sensor 4b is coupled to channel 2b, which extends through the substrate 3 to cavity 6a. The top of sensor 4b is within cavity 6b. However, in other embodiments the positions of the sensors may be reversed, such that the bottom of sensor 4a is coupled to channel 2b and the bottom of sensor 4b is coupled to channel 2a. In the example of FIG. 6A, channels 2a and 2b are formed at different vertical locations within the substrate 3. In some embodiments, the channels 2a and 2b may be at different horizontal locations.

As mentioned above, the substrate 3 may have any number of layers, and may have more than 3 layers. In the example of FIG. 6A, the substrate 3 has five layers (Layer 1-Layer 5), which allows forming the channels 2a and 2b at different depths. However, the structure of FIG. 6A may be formed with a substrate 3 having a different number of layers, as the structures and techniques described herein are not limited in this respect.

Figure 6B:
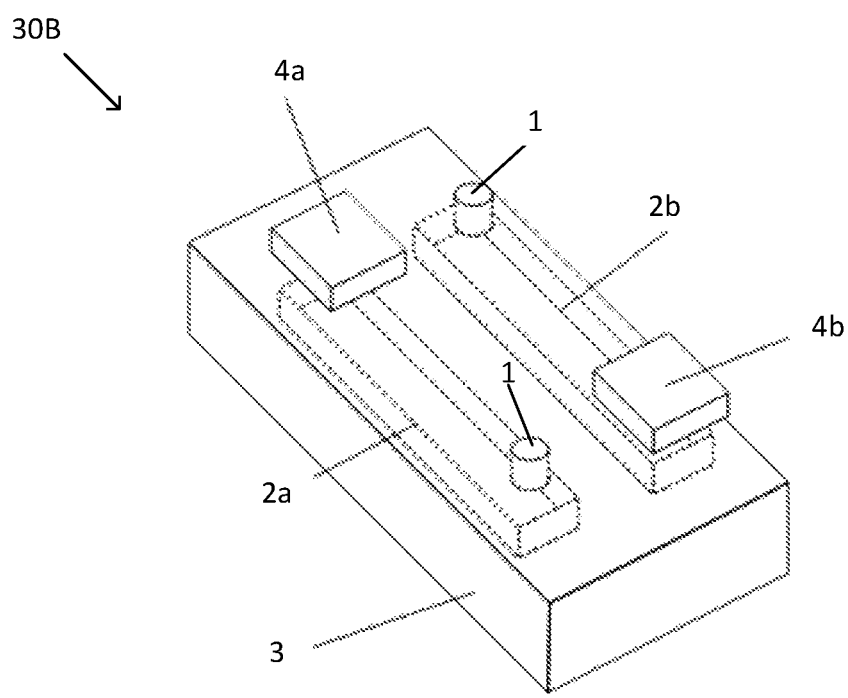

FIG. 6B shows an example of a sensor package 30B similar to that of FIG. 6A, but with channels 2a being separated from one another in a horizontal dimension (e.g., a direction along a top surface of the substrate). For purposes of illustration, lid 5 is not shown in FIG. 6B.

Figure 7A:
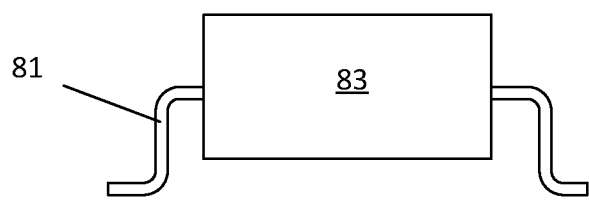
FIGS. 7A and 7B show completed sensor package and options for mounting the sensor package.
Figure 7B:
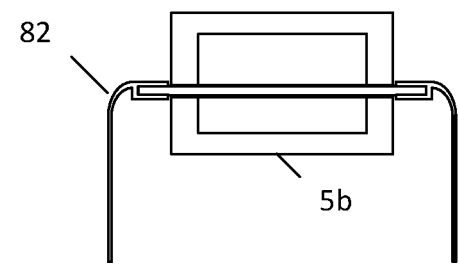

FIGS. 7A and 7B show examples of ways in which fabrication of the sensor package may be completed for different mounting configurations. FIG. 7A shows in example in which a sensor package is encased in a molding compound 83 with a lead frame 81, which may be suitable for surface-mounting the sensor package. FIG. 7B shows another example in which a lid 5b is additionally adhered to the bottom side of the sensor package, and a lead frame 82 may be soldered to the substrate. In other embodiments, the sensor package may be leadless. For example, plated pads (e.g., formed of gold, or another conductor), may be formed on the bottom of the substrate to surface mount the sensor package. However, the sensor packages described herein are not limited to particular mounting configurations.

Various aspects of the apparatus and techniques described herein may be used alone, in combination, or in a variety of arrangements not specifically discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

The terms "substantially," "approximately," "about" and the like refer to a parameter being within 10%, optionally less than 5% of its stated value.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A sensor package, comprising:
   a substrate;
   a first channel within the substrate, the first channel configured to allow flow of a fluid therethrough;
   a second channel within the substrate, the second channel configured to allow flow of the fluid therethrough;
   a first sensor disposed on a surface of the substrate, the first sensor configured to sense a property relating to the fluid associated with the first channel;
   a first opening extending between the first sensor and the first channel;
   a second opening extending between the first channel and the surface;
   a second sensor disposed on the substrate, the second sensor configured to sense a property relating to the fluid associated with the second channel; and
   a lid covering the first sensor and the second sensor, the lid forming at least one cavity between the lid and the substrate, and the at least one cavity comprises a first cavity between the first sensor and the lid.

2. The sensor package of claim 1, wherein the first sensor is a first pressure sensor and the second sensor is a second pressure sensor.

3. The sensor package of claim 2, wherein the first pressure sensor and the second pressure sensor are configured to sense a pressure differential.

4. The sensor package of claim 1, wherein the substrate comprises a printed circuit board.

5. The sensor package of claim 1, wherein the first sensor is configured to perform sensing using at least a pressure of the first cavity.

6. The sensor package of claim 1, further comprising a third opening in the lid allowing fluidic access to the first cavity.

7. The sensor package of claim 6, further comprising a port coupled to the third opening.

8. The sensor package of claim 1, wherein the at least one cavity comprises a second cavity between the second opening and the lid.

9. The sensor package of claim 8, further comprising a port coupled to the second opening.

10. The sensor package of claim 9, wherein the port extends to a top of the lid.

11. The sensor package of claim 9, wherein the lid comprises a third channel extending from the second opening to the port.

12. The sensor package of claim 11, wherein the port extends to a side of the lid.

13. The sensor package of claim 12, wherein the lid has a top portion and a plurality of side portions forming first and second cavities between the top portion and the substrate.

14. A sensor package, comprising:
   a substrate;
   a first channel within the substrate, the first channel configured to allow a medium to pass therethrough;
   a second channel within the substrate, the second channel configured to allow the medium to pass therethrough;
   a first sensor disposed on a surface of the substrate, the first sensor configured to sense a property relating to the medium;
   a first opening extending between the first sensor and the first channel;
   a second opening extending between the first channel and the surface;
   a second sensor disposed on the substrate, the second sensor configured to sense the property relating to the medium; and
   a lid covering the first sensor and the second sensor, the lid having at least one wall adhered to the substrate, the lid forming at least one cavity between the lid and the substrate, and the at least one cavity comprises a first cavity between the first sensor and the lid.

15. The sensor package of claim 14, wherein a bottom edge of the at least one wall is adhered to the substrate.

16. The sensor package of claim 14, wherein the lid further comprises a top portion extending above the first sensor and the second sensor.

17. The sensor package of claim 16, wherein the at least one wall comprises a plurality of walls and the top portion extends between the plurality of walls.

18. The sensor package of claim 14, wherein the medium comprises a fluid or light.

19. The sensor package of claim 14, wherein the surface of the substrate is a top surface of the substrate, and wherein:
   a top of the first channel is below the top surface of the substrate and a bottom of the first channel is above a bottom surface of the substrate; and
   a top of the second channel is below the top surface of the substrate and a bottom of the second channel is above the bottom surface of the substrate.

* * * * *